United States Patent [19]

Guyot

[11] Patent Number: 4,471,270

[45] Date of Patent: Sep. 11, 1984

[54] PARTICLE-IMPACT LOCALIZING DEVICE, A CATHODE-RAY OSCILLOSCOPE AND A PICK-UP TUBE COMPRISING SUCH A DEVICE

[75] Inventor: Lucien Guyot, Paris, France

[73] Assignee: Thomson-CSF, Paris, France

[21] Appl. No.: 243,038

[22] Filed: Mar. 12, 1981

[30] Foreign Application Priority Data

Mar. 14, 1980 [FR] France ............................... 80 05736

[51] Int. Cl.$^3$ ........................................... H03K 17/88
[52] U.S. Cl. .................................... 315/374; 250/578; 178/18; 365/217; 315/10; 358/213
[58] Field of Search ............... 358/213; 250/578, 209, 250/208, 211; 313/366, 384, 385, 386, 392; 315/10; 357/24 LR; 365/217, 183; 382/66, 58, 10; 178/18

[56] References Cited

U.S. PATENT DOCUMENTS

| | | | |
|---|---|---|---|
| 3,209,201 | 9/1965 | Anger | 315/9 |
| 3,400,273 | 9/1968 | Horton | 357/16 |
| 3,693,003 | 9/1972 | Sigsbee et al. | 365/217 |
| 3,777,061 | 12/1973 | Takemura | 357/24 |
| 3,786,441 | 1/1974 | Engeler et al. | 313/392 |
| 3,890,523 | 11/1975 | Poirier | 313/392 |

FOREIGN PATENT DOCUMENTS 2251907 6/1975 France .
2306445 10/1976 France .

OTHER PUBLICATIONS

Xerox Disclosure Journal, vol. 4, No. 3, May–Jun. 1979, Stamford, Conn. USA Jeromin: "X-ray Detector Array", pp. 319–322.
Review of Scientific Instruments, vol. 48, No. 6, Jun. 1977, New York USA Koppel: "Direct Soft X-ray Response of a Charge-coupled Image Sensor", pp. 669–672.

Primary Examiner—Maynard R. Wilbur
Assistant Examiner—Marian Gordon
Attorney, Agent, or Firm—Roland Plottel

[57] ABSTRACT

This device comprises several charge-transfer shift registers integrated on the same semiconductor substrate and disposed one above the other along the axis Oy. The charge-transfer electrodes are common to all the registers and each package of charges injected under an electrode having received the impact of particles is transferred along axis Ox to underneath a diffused zone common to all the registers what causes currents to flow in two electrodes connected to the ends of the zone diffused along axis Ox.

8 Claims, 5 Drawing Figures

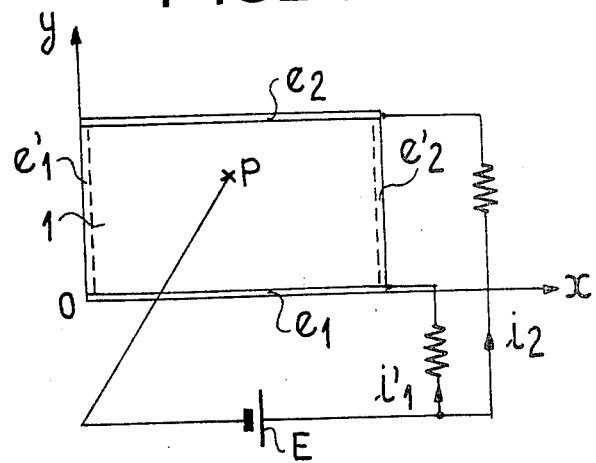
FIG_1 "PRIOR ART"
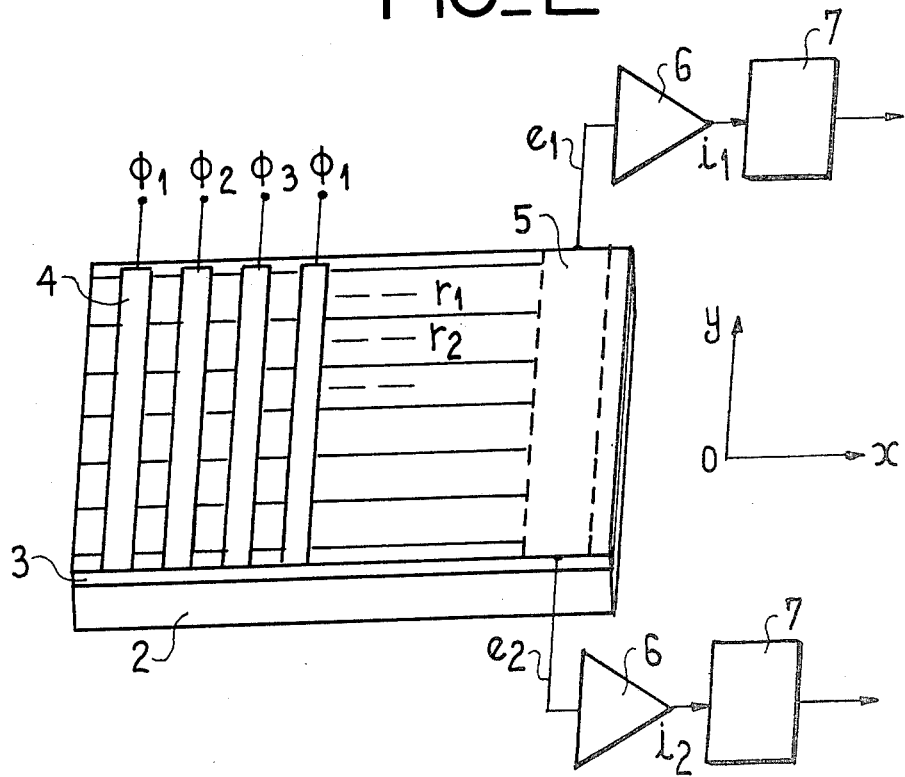
FIG_2

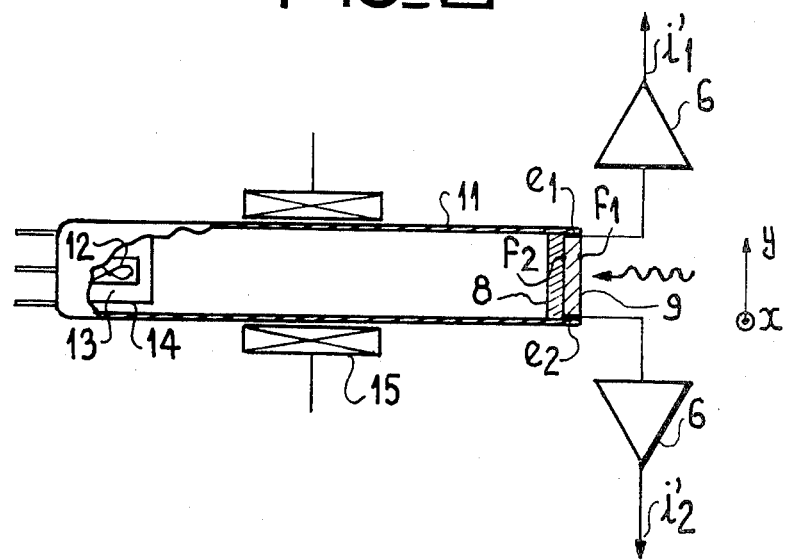
FIG_3
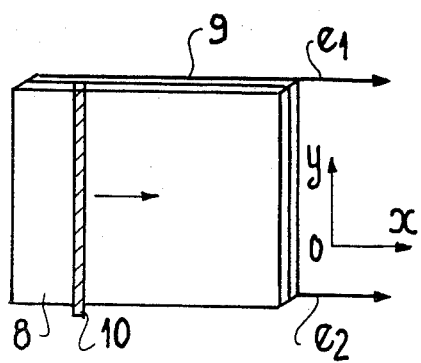
FIG_4
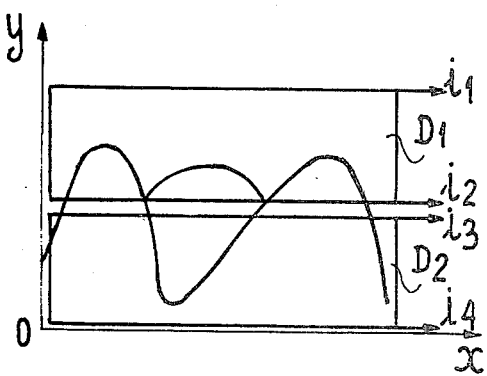
FIG_5

PARTICLE-IMPACT LOCALIZING DEVICE, A CATHODE-RAY OSCILLOSCOPE AND A PICK-UP TUBE COMPRISING SUCH A DEVICE

BACKGROUND OF THE INVENTION

The present invention relates to a particle-impact localizing device. It also relates to cathode-ray oscilloscopes and pick-up tubes comprising such a device.

In the prior art devices are known for localizing the x and y coordinates of an emissive point P based on the following principle.

Starting with a rectangular plate made from a material of uniform resistivity, two opposite sides of which are edged with an electrode made from a weakly resistive material, a current is injected at any point P on this plate by means of a DC voltage source connected between the plate and the electrodes. It is known that there will flow in each electrode currents $i_1$ and $i_2$ such that the x coordinate of point P, along an axis Ox perpendicular to the electrodes, is written:

$$x = (i_1 - i_2)/(i_1 + i_2).$$

To know the y coordinate of point P along as axis Oy perpendicular to Ox, it is sufficient to dispose on the plate two other electrodes perpendicular to the first ones and to inject a current at point P using these electrodes. The y coordinate of point P is written as a function of currents $i'_1$ and $i'_2$ which flow in these electrodes:

$$y = (i'_1 - i'_2)/(i'_1 + i'_2).$$

SUMMARY OF THE INVENTION

The present invention relates to a localizing device which allows not only a sequential succession of points to be localized but a whole curve received simultaneously by the localizor.

The particle-impact localizor of the present invention comprises:

at least one flat sensitive surface caled principal surface having two orthogonal axes, Ox and Oy, which is subjected to the impact of particles causing a modification of the initial electric condition of the surface;

means for the successive reading of the electric condition of the elementary surfaces, having the same dimension along axis Oy as the principal surface and following each other over the principal surface along axis Ox, and ensuring, for each elementary surface receiving an impact of particles, the passage in two electrodes of reading currents ($i_1$ and $i_2$) taken at the ends along axis Ox of each elementary surface.

The particle-impact localizor of the present invention presents numerous advantages among which may be mentioned the fact that it allows localization of a curve by using scanning which is more rapid, because simpler, than television scanning. In fact, the sensitive surface of the localizor is divided along axis Ox into elementary surfaces which are determined either by the dimensions of the reading beam, or by the dimensions of the storage electrodes depending on the embodiments. The very existence of these elementary surfaces which are read one after the other allows localization along Ox whereas the measurement of the reading currents taken at the ends along axis Ox of each elementary surface allows localization along axis Oy of the impact point of the particles on a given elementary surface.

The device of the invention associated with a memory which stores the successive values of the reading currents $i_1$ and $i_2$ may be used for recording electric signals, particularly when there is only available for study of these signals a standard oscilloscope not only having a memory or having a memory which is not very rapid. In fact, the memorized signals may be restored at an adjustable rate.

The device of the invention may also be used in a pick-up tube of the vidicon type where it allows the impact of a light signal $y = f(x)$ to be localized with simplified scanning by electron beam.

DESCRIPTION OF THE DRAWINGS

Other objects, characteristics and results of the invention will appear from the following description, given by way of nonlimiting example and illustrated by the accompanying figures in which:

FIG. 1 is a diagram showing the principle of the localizors of the prior art;

FIG. 2 shows a charge-transfer localizor in accordance with the invention;

FIG. 3 shows a pick-up tube of the vidicon type comprising a device in accordance with the invention;

FIG. 4 is a front view of the device of the invention used in the tube of FIG. 3;

FIG. 5 shows a particular embodiment of the device of the invention.

In different figures, the same references designate the same parts but, for the sake of clarity, the sizes and proportions of the different elements are not respected.

DESCRIPTION OF THE PREFERRED EMBODIMENTS

FIG. 1 shows a diagram illustrating the principle of the localizors of the prior art.

These localizors allow the x and y coordinates of an emissive point P to be known in a system of rectangular axes Ox and Oy.

The principle which has been previously described is the following.

We start with a rectangular plate 1 made from a material of uniform resistively. Two electrodes $e_1$ and $e_2$ edge two opposite sides parallel to the axis Ox of this plate. A DC voltage source E allows a current to be injected at any point P on the plate. This source is connected between the plate and the electrodes. If we call $i'_1$ and $i'_2$ the currents which flow in electrodes $e_1$ and $e_2$, the y coordinate of point P is written: $y = (i'_1 - i'_2)/(i'_1 + i'_2)$.

To obtain the x coordinate of point P, it is similarly necessary to inject a current at point P using two electrodes $e'_1$ and $e'_2$ covering the other two edges of plate 1.

FIG. 2 shows a charge-transfer localizor in accordance with the invention.

This localizor comprises a principal surface formed by several charge-transfer shift registers $r_1$, $r_2$, $r_3$... disposed one above the other along axis Oy.

These registers are integrated on the same semiconductor substrate 2 covered with an insulting layer 3. The most currently used semiconductor substrate is silicon.

Insulting diffusions consisting in overdoping of the substrate which raises the inversion threshold and thus opposes any storage of the charges allows several registers to be formed, in a known way, isolated from each other on the same substrate.

On insulating layer 3, electrodes 4 are disposed parallel to one another and to axis Oy. These electrodes are common to all the registers.

The semiconductor substrate is subjected to the impact of particles which may come from light radiation, from the image of the screen of a cathode-ray oscilloscope projected on the substrate by means of an optical system for example. This light radiation may reach the localizor either from the side where electrodes 4 are to be found, which must then be photosensitive, or from the other side. The particles which the localizor receives may also be electrons, the electrons of the beam of an oscilloscope for example.

Electrodes 4 determine on the substrate 2 elementary surfaces. The charges due to the impact of the particles which are stored under the electrodes are read by simultaneous transfer of the charges into all the registers, from one electrode 4 to the following one, in direction Ox, as far as a diffused zone 5 common to all the registers.

To cause the transfer of charges from one electrode to the next, electrodes 3 may be subjected to three period clock signals having the same period T, but shifted in phase with respect each other $\phi_1$, $\phi_2$, $\phi_3$.

The transfer of the charges in a given direction may also be obtained, in a known way, by using structure heterogenities such as an oxide overthickness or impurity concentrations in the substrate.

The diffused zone 5 is of the opposite type to that of the substrate. It dimension along axis Oy is at least equal to the dimension which the whole of the registers occupies along axis Oy. The charges from all the registers are then transferred under this diffused zone 5.

The curves which the device shown in FIG. 2 allows to be localized must have only one value of y for each value of x.

The operation of the localizor of the invention takes place in two stages:

in a first stage, the localizor is subjected to the impact of the particles;

in a second stage, the localizor is withdrawn from the impact of the particles and the transfer of charges is caused under zone 5. At a given moment, it is known (by taking into account the number of clock pulses for transferring charges under zone 5), which electrode 4, i.e. which elementary surface, has received the impact which created the charges present under zone 5. Localization along Ox is thus achieved. To achieve localization along Oy, the principle of the localizors of the prior art is used. The ends along Ox of zone 5 are connected to two electrodes $e_1$ and $e_2$ connected to two amplifiers 6. The amplifiers 6 deliver currents $i_1$ and $i_2$ on arrival of each package of charges under diffused zone 5.

The normed difference of currents $(i_1-i_2)/(i_1+i_2)$ gives the y coordinate. Furthermore, the sum of the currents gives the intensity of the light radiation or of the electron beam received.

Currents $i_1$ and $i_2$ are stored separately, in analog form or after digitalization, as in the case of FIG. 1 where the memories are referenced at 7. Currents $i_1$ and $i_2$ may also be processed in real analysis time so as to obtain the ration $(i_1-i_2)/(i_1+i_2)$ which is then stored.

The speed of localization of the impact of the particles which is achieved by means of the device of FIG. 2 may be adapted to the speed of the circuits processing currents $i_1$ and $i_2$.

The localizing speed may be very high. The frequency of transfer signals $\phi_1$, $\phi_2$, $\phi_3$ may go from 10 to 100 MHz.

The localizing speed may also be very low since it is possible to obtain storage of the data in the silicon for several minutes if the silicon is cooled to a low temperature.

The localizing device shown in FIG. 2 may be used, as we have seen, for storing the coordinates of the curve $y=f(x)$ which appears on the screen of the oscilloscope. To display this curve again, it is sufficient to apply to the plates of a cathode-ray oscilloscope the stored coordinates.

FIG. 3 shows a pick-up tube of the vidicon type comprising a localizing device in accordance with the invention.

This tube comprises a vacuum envelope 11 in which there is placed an electron gun which comprises a linear emitting cathode 13, a heating filament 12 and a cylindrical control grid or Wehnelt 14. The focusing and deflection devices for the electron beam emitted by the cathode are shown symbolically and referenced at 15. The focusing is magnetic, the deflection may be magnetic or electrostatic.

This tube comprises a localizing device in accordance with the invention which is formed from a rectangular resistive plate 9 whose two opposite sides, along axis Ox, are edged by an electrode, $e_1$ and $e_2$, made from a weakly resistive material. Each electrode is connected to an amplifier 6 which supplies reading currents $i'_1$ and $i'_2$. This resistive plate 9 receives on one of its faces $f_1$ light radiation, symbolized by a wavy arrow, whose impact it is desired to localize. Plate 9 is transparent to this radiation. The other face $f_2$ of plate 9 is covered with a photoconducting layer 8.

Resistive plate 9 may be made from tin or indium oxide and electrodes $e_1$ and $e_2$ may be formed from copper, gold or silver strips . . . of a thickness varying from 0.1 to a few microns.

FIG. 4 shows a front view of the device of the invention used in the tube of FIG. 3.

Photoconducting layer 8 is periodically scanned by the electron beam 10 emitted by cathode 12. This electron beam is lamellar, i.e. that it has a small dimension along axis Ox and that its dimension along axis Oy is at least equal to that of resisive plate 9. Finally, this electron beam moves along axis Ox, perpendicularly to electrodes $e_1$ and $e_2$; the lamellar electron beam 10 determines during its movement the elementary surfaces of photoconducting layer 8 on which it neutralizes the charges created by illumination by causing currents, $i'_1$ and $i'_2$, to flow in electrodes $e_1$ and $e_2$ carried by plate 9.

Electron beam 10 is subjected to scanning along Ox which may be very rapid, from a few microseconds to 10 microseconds. It is possible to adapt the scanning speed to the passband of the circuits processing signals $i'_1$ and $i'_2$. The sum of the intensity of the reading currents is of the order of 300 n A and the signal-to-noise ratio is high. Finally, the resolution is greater than 500 points along Ox and of the order of 300 to 400 points along Oy for a rectangular resistive plate of 9.5×12.5 mm.

The same device may be used in an oscilloscope for localizing the electron beam of the oscilloscope. It is then deposited on a support grid from which it is separated by an insulation means. The device then operates by using the principle of induced conductibility.

When it is desired to localize an oscillogram formed by a curve having several values of y for the same value of x, as is the case in FIG. 5, it is sufficient to use several devices $D_1$, $D_2$, such as those which have just been described, disposed one above the other along Oy.

These devices deliver currents $i'_1$ and $i'_2$, $i_3$ and $i_4$ which allow localization of several impact points along Oy for the same value of x. The scanning of the sensitive surfaces along elementary surfaces (by a lamellar electron beam, by clock signals $\phi_1$, $\phi_2$, $\phi_3$ applied to charge-transfer electrodes . . . ) may be advantageously common to the different devices $D_1$, $D_2$ . . .

What is claimed is:

1. A particle-impact localizing device for localizing curves due to particle impact, with only one value along a first axis for each value along a second axis orthogaonal to the first axis comprising:

several charge-transfer shift registers diposed one above the other along a first axis (Oy), said registers being integrated on the same semiconductor substrate covered with an insulting layer, electrodes for transferring charges in the registers being common to all the registers and being disposed on the insulting layer;

a diffused zone in said substrate, of the opposite conductivity type to that of the substrate, into which are transferred charges coming from all the registers, said zone having a dimension along said first axis at least equal to that occupied by the registers and its ends along the second axis being connected to electrodes which are connected to two amplifiers delivering the currents for reading the charges for localization along the first axis.

2. The device as claimed in claim 1, wherein the semiconductor substrate is made from silicon.

3. The device as claimed in claim 1, wherein said electrodes (4) are photosensitive.

4. The device as claimed in claim 1, wherein memories are provided which store the successive values of the reading currents or their linear combination.

5. A cathode-ray oscilloscope comprising a device as claimed in claim 1, whose semiconductor substrate receive the image from the screen of the oscilloscope projected by means of an optical system or whose semiconductor substrate receives the electrons from the beam of the oscilloscope.

6. A particle-impact localizing device for localizing curves due to light radiation, with only one value along a first axis for each value along a second axis orthogonal to the first axis comprising:

a resistive plate, said plate receiving on one of its faces light radiation to which it is transparent and being covered on the other face with a photoconducting layer, said face transparent to light radiation comprising on its edges parallel to a first axis two parallel electrodes made from a weakly resistive material;

a lamellar electron beam, perpendicularly to said electrodes, moving along said first axis and neutralizing charges created by illumination by causing reading currents to flow in said two electrodes, said electrodes being connected to two amplifiers delivering the currents for reading the charges, thereby allowing localization along a second axis, orthogonal to the first axis.

7. A pick-up tube comprising a device such as claimed in claim 6, whose photoconducting layer is scannd by an electron beam emitted by the linear cathode of the tube.

8. The device as claimed in claim 6, wherein memories are provided which store the successive values of the reading currents of their linear combination.

* * * * *